United States Patent
Minemura et al.

(10) Patent No.: US 8,804,402 B2
(45) Date of Patent: Aug. 12, 2014

(54) NONVOLATILE SEMICONDUCTOR MEMORY DEVICE

(71) Applicants: Yoichi Minemura, Yokkaichi (JP); Takayuki Tsukamoto, Yokkaichi (JP); Hiroshi Kanno, Yokkaichi (JP); Takamasa Okawa, Yokkaichi (JP)

(72) Inventors: Yoichi Minemura, Yokkaichi (JP); Takayuki Tsukamoto, Yokkaichi (JP); Hiroshi Kanno, Yokkaichi (JP); Takamasa Okawa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 13/722,210

(22) Filed: Dec. 20, 2012

(65) Prior Publication Data
US 2014/0063906 A1 Mar. 6, 2014

Related U.S. Application Data (60) Provisional application No. 61/695,532, filed on Aug. 31, 2012.

(51) Int. Cl.
*G11C 13/00* (2006.01)

(52) U.S. Cl.
CPC .................................. *G11C 13/0097* (2013.01)
USPC ......................................................... 365/148

(58) Field of Classification Search
CPC .................................................... G11C 13/0097
USPC ......................................................... 365/148
See application file for complete search history.

(56) References Cited

U.S. PATENT DOCUMENTS

| | | | |
|---|---|---|---|
| 2009/0010039 A1* | 1/2009 | Tokiwa et al. | 365/148 |
| 2010/0027308 A1 | 2/2010 | Maejima | |
| 2010/0046275 A1* | 2/2010 | Hosono et al. | 365/148 |
| 2010/0124097 A1 | 5/2010 | Takase | |
| 2010/0232208 A1 | 9/2010 | Maejima et al. | |
| 2010/0246302 A1 | 9/2010 | Seko | |
| 2012/0075912 A1* | 3/2012 | Hosono | 365/148 |
| 2012/0236628 A1* | 9/2012 | Ikeda et al. | 365/148 |
| 2013/0121056 A1* | 5/2013 | Liu et al. | 365/148 |
| 2013/0250650 A1* | 9/2013 | Sasaki | 365/148 |

FOREIGN PATENT DOCUMENTS

| | | |
|---|---|---|
| JP | 2010-033675 A | 2/2010 |
| JP | 2010-123198 A | 6/2010 |
| JP | 2010-218615 A | 9/2010 |
| JP | 2010-231828 A | 10/2010 |
| JP | 2013-109796 A | 6/2013 |

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

A nonvolatile semiconductor memory device according to an embodiment comprises: a memory cell array including a plurality of memory cells provided at each of intersections of a plurality of first lines and a plurality of second lines; and a control circuit applying a selected first line voltage to a selected first line, an adjacent unselected first line voltage which is larger than the selected first line voltage to an adjacent unselected first line, and an unselected first line voltage which is larger than the adjacent unselected first line voltage to an unselected first line, and applying a selected second line voltage which is larger than the selected first line voltage to a selected second line and an unselected second line voltage which is smaller than the selected second line voltage to an unselected second line.

20 Claims, 9 Drawing Sheets

NONVOLATILE SEMICONDUCTOR MEMORY DEVICE

CROSS-REFERENCE TO RELATED APPLICATION

This application is based upon and claims the benefit of priority from the prior U.S. Provisional Application 61/695,532, filed on Aug. 31, 2012, the entire contents of which are incorporated herein by reference.

BACKGROUND

1. Field

Embodiments of the present invention relate to a nonvolatile semiconductor memory device.

2. Description of the Related Art

In recent years, ReRAM (Resistive RAM) is receiving attention as a technology for realizing an even higher level of integration in nonvolatile semiconductor memory devices.

A memory cell array in this ReRAM is configured having a variable resistance element and a rectifier element such as a diode or the like which is a selection element connected in series. The variable resistance element has at least two resistance states, and switching of these resistance states is performed by voltage application to the variable resistance element. Moreover, the case where voltages of the same polarity are used when switching between these two resistance states is called a unipolar operation, and the case where voltages of different polarities are used when switching between these two resistance states is called a bipolar operation.

In the case that, of these two operations, a bipolar operation is performed, the diode or the like which is the rectifier element requires to have the following two conflicting properties, namely that when a reverse direction bias is applied to an unselected memory cell, an off leak current flowing in the unselected memory cell is kept small, and that when a reverse direction bias is applied to a selected memory cell, the selected memory cell can be supplied with an operation current required for switching of the resistance state of the variable resistance element.

DETAILED DESCRIPTION

A nonvolatile semiconductor memory device according to an embodiment comprises: a memory cell array including a plurality of first lines and a plurality of second lines that intersect one another, and a plurality of memory cells provided at each of intersections of the plurality of first lines and the plurality of second lines; and a control circuit for applying a voltage to the plurality of first lines and the plurality of second lines, each of the memory cells including a variable resistance element and a rectifier element connected in series, and having one of the first lines connected to an anode side of said rectifier element and one of the second lines connected to a cathode side of said rectifier element, and, when it is assumed that one of the memory cells which is to be an access target is a selected memory cell, one of the first lines connected to the selected memory cell is a selected first line, one of the first lines adjacent to the selected first line is an adjacent unselected first line, a remaining one of the first lines is an unselected first line, one of the second lines connected to the selected memory cell is a selected second line, and a remaining one of the second lines is an unselected second line, the control circuit applying a selected first line voltage to the selected first line, an adjacent unselected first line voltage which is larger than the selected first line voltage to the adjacent unselected first line, and an unselected first line voltage which is larger than the adjacent unselected first line voltage to the unselected first line, and applying a selected second line voltage which is larger than the selected first line voltage to the selected second line and an unselected second line voltage which is smaller than the selected second line voltage to the unselected second line.

A nonvolatile semiconductor memory device according to embodiments is described below with reference to the accompanying drawings.

First Embodiment

First, an overall configuration of a nonvolatile semiconductor memory device according to a first embodiment is described.

Figure 1:
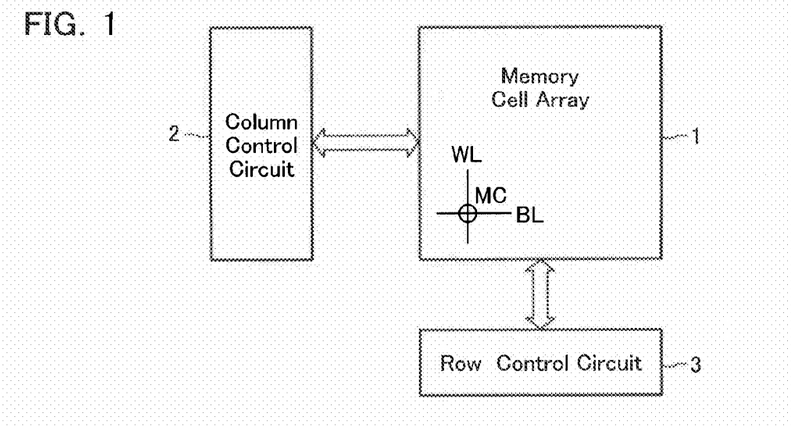
FIG. 1 is a functional block diagram of a nonvolatile semiconductor memory device according to a first embodiment.

FIG. 1 is a functional block diagram of the nonvolatile semiconductor memory device according to the present embodiment.

This nonvolatile semiconductor memory device includes a memory cell array 1 configured from a plurality of bit lines BL (first lines) and a plurality of word lines WL (second lines) that intersect one another, and a plurality of memory cells MC provided at each of intersections of these plurality of bit lines BL and plurality of word lines WL. Note that in the description below, the bit lines BL and word lines WL are sometimes also referred to simply by the collective term "wiring lines".

In addition, this nonvolatile semiconductor memory device includes a column control circuit 2 for controlling the bit lines BL and a row control circuit 3 for controlling the word lines WL. The column control circuit 2 and the row control circuit 3 are included in a control circuit. Operation of these column control circuit 2 and row control circuit 3 results in data erase of the memory cells MC, data write to the memory cells MC, and data read from the memory cells MC being performed.

Next, a structure of the memory cell array 1 is described.

Figure 2:
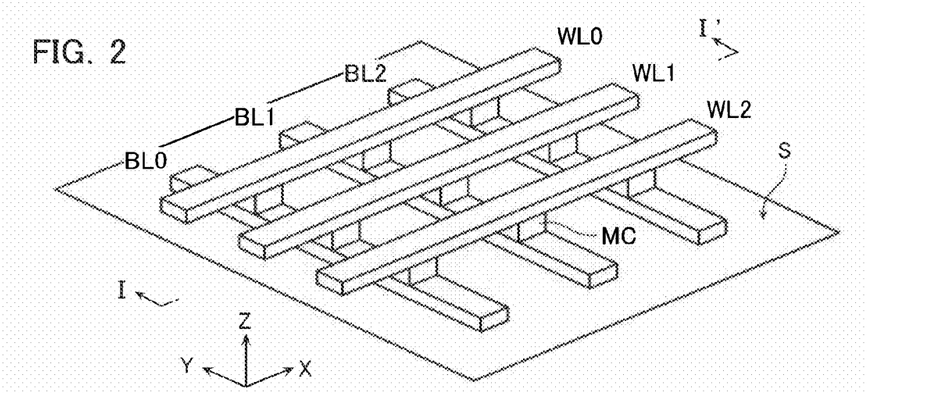
FIG. 2 is a perspective view of part of a memory cell array in the nonvolatile semiconductor memory device according to the same embodiment.
Figure 3A:
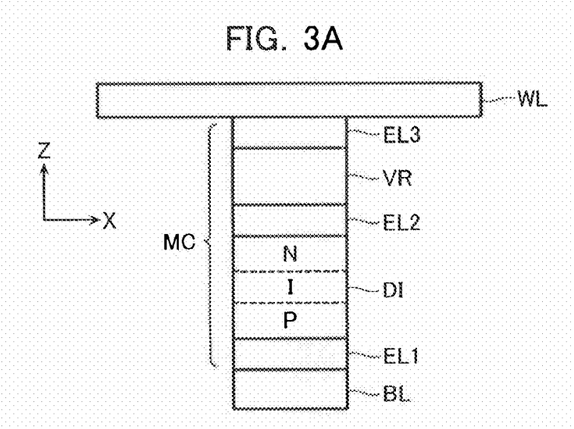
FIG. 3A is a cross-sectional view of a memory cell in the nonvolatile semiconductor memory device according to the same embodiment.

FIG. 2 is a perspective view of part of the memory cell array 1; FIG. 3A is a cross-sectional view of FIG. 2 taken along the line I-I' and viewed in the direction of the arrows, showing a single one of the memory cells MC of FIG. 2; and FIG. 3B is a circuit diagram of the memory cell MC corresponding to the cross-sectional view of FIG. 3A.

The memory cell array 1 includes, on a semiconductor substrate S having as principal plane an X-Y plane, the plurality of bit lines BL extending in a Y direction and aligned with a certain pitch in an X direction in the X-Y plane, and, on these bit lines BL, the plurality of word lines WL extending in the X direction and aligned with a certain pitch in the Y direction in the X-Y plane. Moreover, formed in the memory cell array 1 are the plurality of memory cells MC provided at each of intersections of the bit lines BL and the word lines WL.

Each of the memory cells MC is configured from a diode DI (a diode is one example of a rectifier element) and a variable resistance element VR connected in series from the bit line BL toward the word line WL.

Figure 3B:
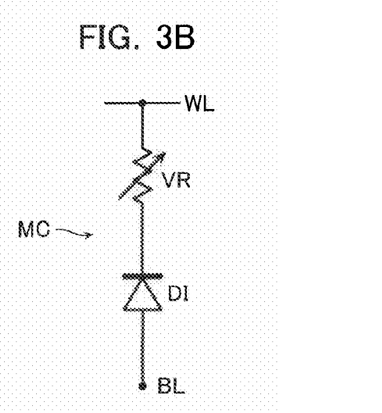
FIG. 3B is a circuit diagram of the memory cell corresponding to the cross-sectional view of FIG. 3A.

In the case of FIG. 3A and FIG. 3B, the memory cell MC has a structure in which, stacked sequentially from the bit line BL toward the word line WL, are: an electrode EL1 having for example a titanium nitride film (TiN) as a material; a P type semiconductor film (P in FIG. 3A); an intrinsic semiconductor film (I in FIG. 3A); an N type semiconductor film (N in FIG. 3A); an electrode EL2 having for example a titanium nitride film (TiN) as a material; the variable resistance element VR having for example a hafnium oxide film ($HfO_x$) as a material; and an electrode EL3 having for example a titanium nitride film (TiN) as a material. Of these, the P type semiconductor film, the intrinsic semiconductor film, and the N type semiconductor film configure the diode DI.

Next, operation of the nonvolatile semiconductor memory device according to the present embodiment is described.

The variable resistance element VR in the memory cell MC has a property that applying an electrical stress to the variable resistance element VR causes a resistance state of the variable resistance element VR to change. The variable resistance element VR has at least two resistance states, namely a low-resistance state and a high-resistance state. In the present embodiment, an operation where the variable resistance element VR in a high-resistance state undergoes transition to a low-resistance state is called a "setting operation", and an operation causing the setting operation to be performed on the variable resistance element VR is called a "write operation". On the other hand, an operation where the variable resistance element VR in a low-resistance state undergoes transition to a high-resistance state is called a "resetting operation", and an operation causing the resetting operation to be performed on the variable resistance element VR is called an "erase operation".

Operation systems of the variable resistance element VR include unipolar operation and bipolar operation. In the case of unipolar operation, a voltage resulting in a forward direction bias in the diode DI is applied to the variable resistance element VR during both of the write operation and the erase operation. On the other hand, in the case of bipolar operation, for example, a voltage resulting in a forward direction bias in the diode DI is applied to the variable resistance element VR during the write operation, whereas a voltage resulting in a reverse direction bias in the diode DI is applied to the variable resistance element VR during the erase operation. Note that the present embodiment deals particularly with a bipolar operation where a reverse direction bias is applied to the diode DI in the memory cell MC. Below, this operation is dealt with as an erase operation (resetting operation), but the present embodiment is applicable also to the write operation (setting operation). Moreover, below, a voltage required in the resetting operation of the memory cell MC is sometimes called an "operation voltage", and a current flowing at this time is sometimes called an "operation current".

Operation of a nonvolatile semiconductor memory device according to a comparative example is here described as a premise for describing operation of the nonvolatile semiconductor memory device according to the present embodiment.

Figure 12:
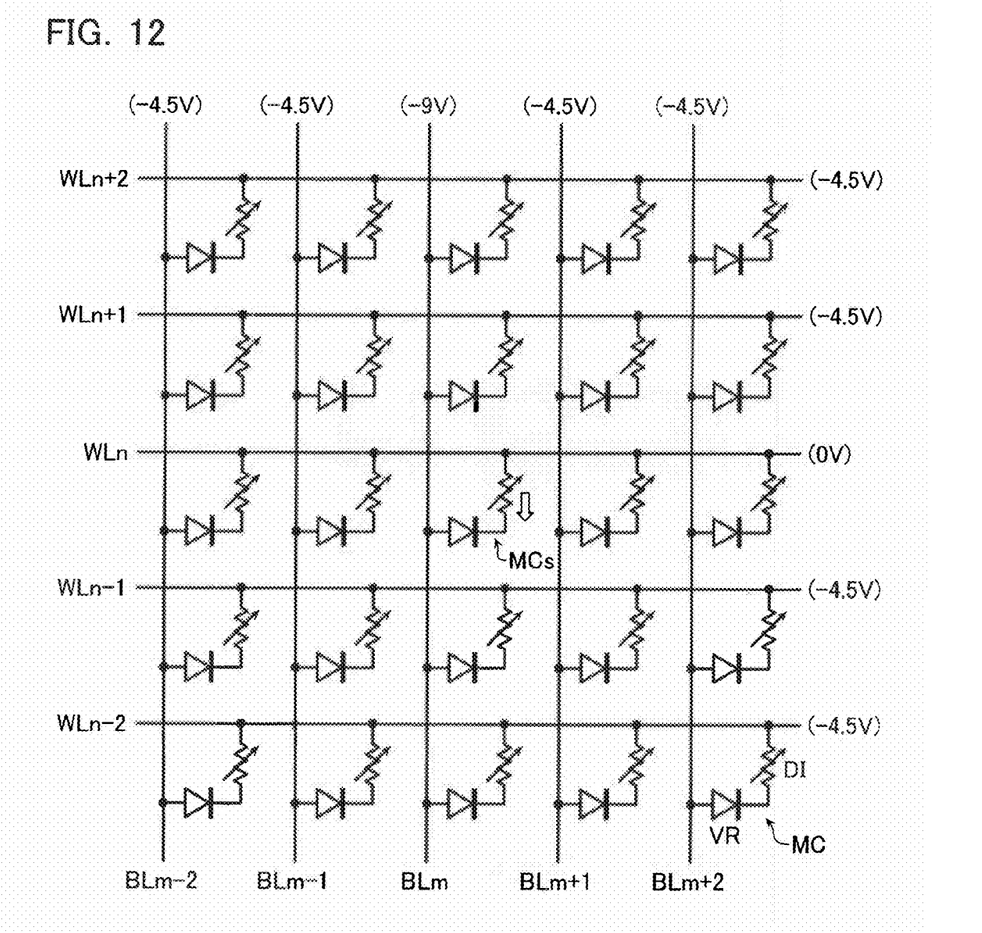
FIG. 12 is a view explaining a bias state of a memory cell array in a nonvolatile semiconductor memory device according to a comparative example.

FIG. 12 is a view explaining a bias state of a memory cell array in the nonvolatile semiconductor memory device according to the comparative example.

FIG. 12 shows bit lines BLm−2~BLm+2 (where m is an integer of value 2 or more), word lines WLn−2~WLn+2 (where n is an integer of value 2 or more), and memory cells MC formed at each of intersections of these bit lines BL and word lines WL. Each of the memory cells MC has the bit line BL connected to an anode side of a diode DI and the word line WL connected to a cathode side of the diode DI via a variable resistance element VR.

Note that the bias state of the memory cell array shown in FIG. 12 shows the case of assuming that the bit line BLm is a selected bit line, the word line WLn is a selected word line, and a memory cell MCs connected to the selected bit line BLm and the selected word line WLn is a selected memory cell.

In the case of the comparative example, when the erase operation is performed on the selected memory cell MCs, a selected bit line voltage −9 V is applied to the selected bit line BLm and an unselected bit line voltage −4.5 V is applied to the unselected bit lines BL from a column control circuit, and a selected word line voltage 0 V is applied to the selected word line WLn and an unselected word line voltage −4.5 V is applied to the unselected word lines WL from a row control circuit. This enables a reverse direction bias of 9 V to be applied to the selected memory cell MCs and the operation current required for the resetting operation (outline arrow in FIG. 12) to be caused to flow. On the other hand, the unselected memory cells MC connected to the selected bit line BLm and the unselected word lines WL and the unselected memory cells MC connected to the unselected bit lines BL and the selected word line WLn (below, an unselected memory cell connected to a selected wiring line and an unselected wiring line is called a "half-selected memory cell") are only applied with a reverse direction bias of 4.5 V which is insufficient to cause the resetting operation to occur. Moreover, the unselected memory cells MC connected to the unselected bit lines BL and the unselected word lines WL are not applied with a bias. As a result, the resetting operation can be caused to occur only in the selected memory cell MCs.

However, when considering power consumption during the erase operation, it is desired that the operation current be caused to flow in the selected memory cell MCs by a lower operation voltage. On the other hand, it is desired that a sneak current due to off leak current flowing in half-selected memory cells MC be reduced.

Accordingly, the present embodiment focuses on the phenomenon below during the erase operation in the comparative example.

Figure 13:
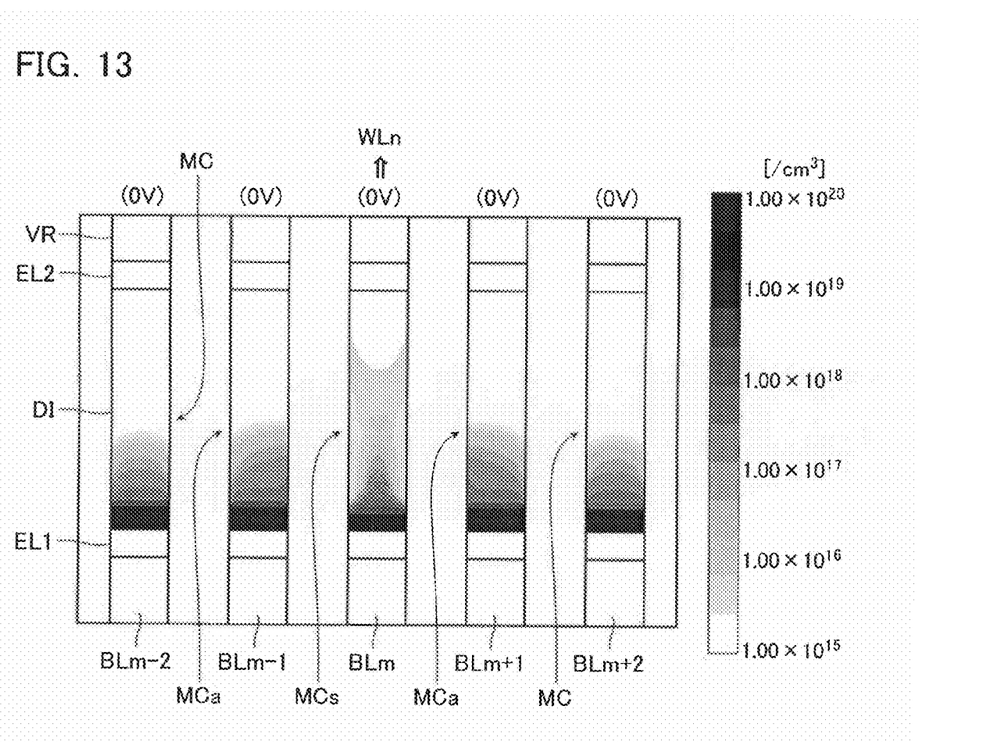
FIG. 13 is a view explaining a carrier density distribution in a diode of a memory cell in the nonvolatile semiconductor memory device according to the same comparative example.

FIG. 13 is a view showing a carrier (hole) density distribution in the diodes DI of the memory cells MC in the comparative example. This view shows cross-sections of the selected memory cell MCs and half-selected memory cells MC connected to the bit lines BLm−2~BLm+2 and the selected word line WLn.

As previously mentioned, in the erase operation of the comparative example, −9 V is applied to the selected bit line BLm, and −4.5 V is applied to the unselected bit lines BL. At this time, a hole concentration in the diode DI of the selected memory cell MCs connected to the selected bit line BLm is found to be lower than in the half-selected memory cells MC due to the effect on the selected bit line BLm of a potential difference of 4.5 V of the unselected bit lines BLm−1 and BLm+1 adjacent to this selected bit line BLm (below, an unselected bit line adjacent to the selected bit line is sometimes also called an "adjacent unselected bit line"). In other words, the diode DI in the selected memory cell MCs is in a state where it is difficult for the operation current to flow. On the other hand, the hole concentration in the diodes DI of the half-selected memory cells connected to the adjacent unselected bit lines BLm−1 or BLm+1 (termed "MCa" for convenience in the description herein) is found to be higher than in the other half-selected memory cells MC due to the effect on the adjacent bit lines BLm−1 or BLm+1 of a potential difference of −4.5 V of the selected bit line BLm. In other words, the diodes DI in the half-selected memory cells MCa are in a state where it is easy for an off leak current to flow.

In view of the above, the present embodiment adopts a bias state described below in the memory cell array 1 during a bipolar operation erase operation.

Figure 4:
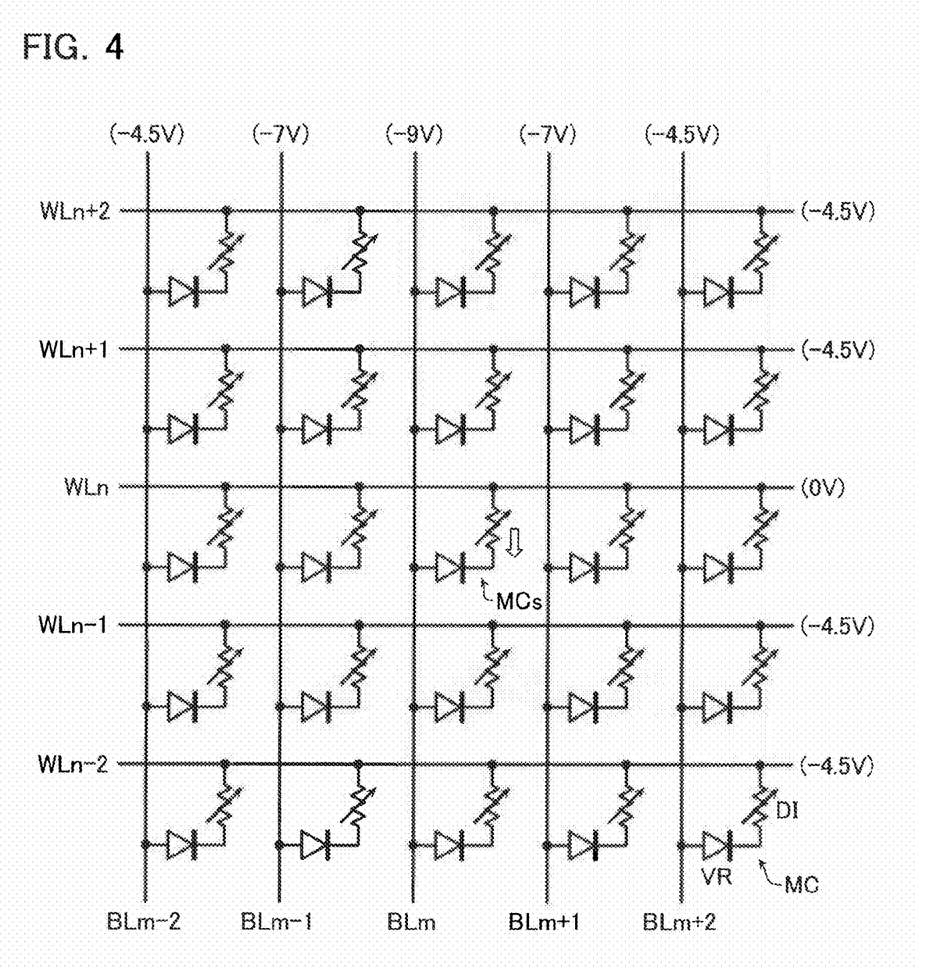
FIG. 4 is a view showing a bias state of the memory cell array in the nonvolatile semiconductor memory device according to the same embodiment.

FIG. 4 is a view showing a bias state of the memory cell array 1.

In the case of the embodiment shown in FIG. 4, and different from the case of the comparative example, an adjacent unselected bit line voltage (for example, −7 V) which is higher than the selected bit line voltage (for example, −9 V) and lower than the unselected bit line voltage (for example, −4.5 V) is applied to the adjacent unselected bit lines BLm−1 and BLm+1 from the column control circuit 2. This results in the potential difference of the adjacent bit lines BLm−1 or BLm+1 with respect to the selected bit line BLm becoming smaller in the selected memory cell MCs. This enables the reduction in hole concentration of the diode DI in the selected memory cell MCs as in the comparative example to be suppressed. In other words, the case of the present embodiment makes it possible to create a state where it is easier for the operation current to flow in the diode DI of the selected memory cell MCs than in the comparative example. In other words, this means that the operation voltage that needs to be applied when it is desired to cause the same level of operation current to flow in the selected memory cell MCs is smaller in the case of the present embodiment than in the case of the comparative example. Moreover, if the operation voltage, in other words, the reverse direction bias can be reduced, the reverse direction bias applied to the half-selected memory cells MCh can also be reduced, whereby a sneak current flowing into the selected bit line BLm and the selected word line WLn can be suppressed and the operation voltage further reduced.

Note that in the description below, a voltage applied to the adjacent unselected wiring lines for suppressing the reduction in carrier concentration in the diode of the selected memory cell is sometimes called an "assist voltage", and a wiring line to which this assist voltage is applied is sometimes called an "assist wiring line".

Figure 5:
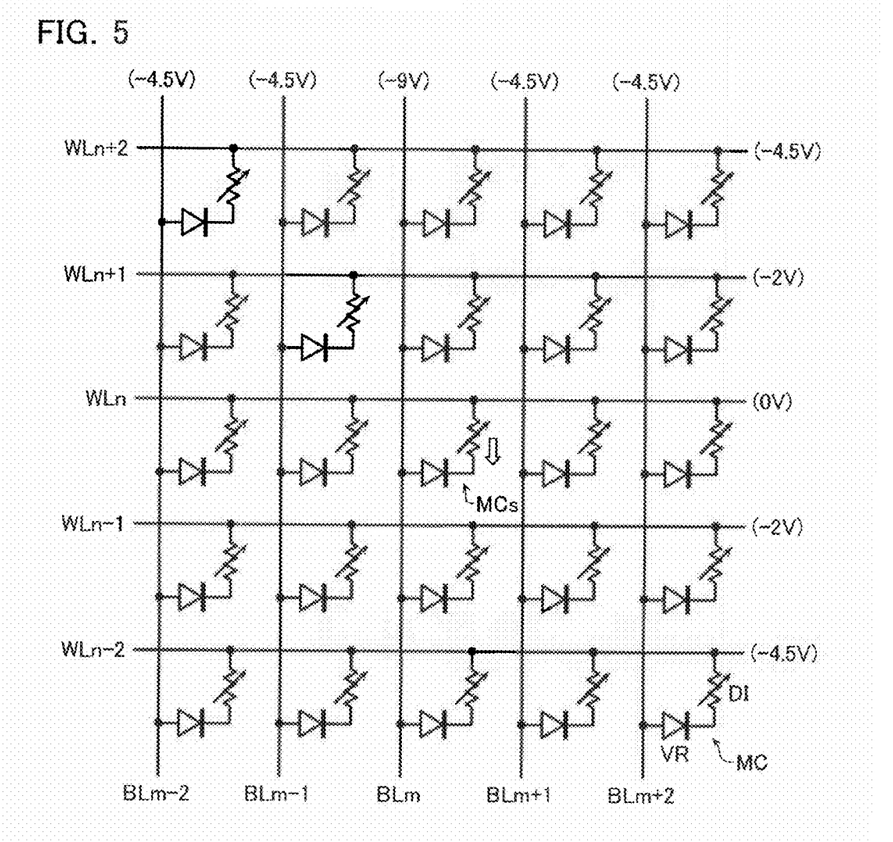
FIG. 5 is a view showing a bias state of the memory cell array in the nonvolatile semiconductor memory device according to the same embodiment.

That concludes description of the case where the adjacent unselected bit lines are adopted as the assist wiring lines, but as shown in FIG. 5, the unselected word lines WLn−1 and WLn+1 adjacent to the selected word line WLn (below, called "adjacent unselected word lines") may be adopted as the assist wiring lines, and an adjacent unselected word line voltage (which is the assist voltage, for example, −2 V) which is lower than the selected word line voltage (for example, 0 V) and higher than the unselected word line voltage (for example, −4.5 V) may be applied to the adjacent unselected word lines WLn−1 and WLn+1 from the row control circuit 3. In this case, electron concentration in the diode DI of the selected memory cell MCs rises as a result of the potential difference of the adjacent unselected word lines WLn−1 or WLn+1 with respect to the selected word line WLn being relaxed from −4.5 V to −2 V. In other words, the case of the present embodiment makes it possible to create a state where it is easier for the operation current to flow in the diode DI of the selected memory cell MCs than in the comparative example.

Figure 6A:
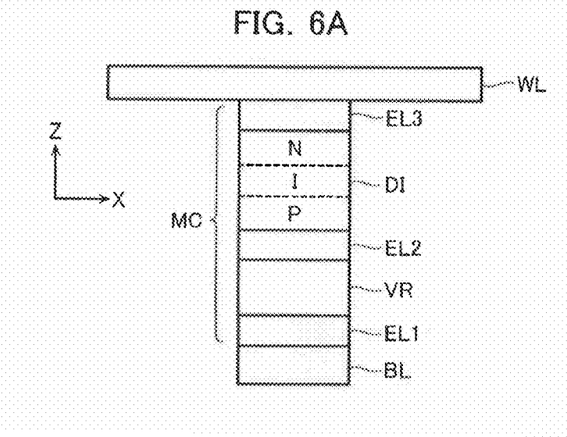
FIG. 6A is a cross-sectional view of a memory cell in the nonvolatile semiconductor memory device according to the same embodiment.
Figure 6B:
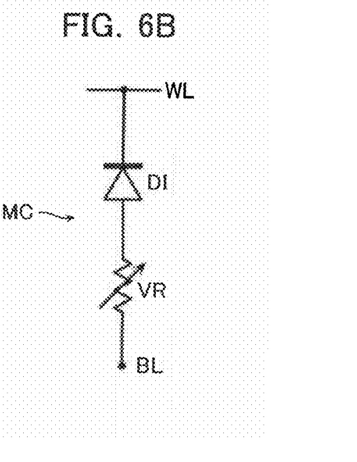
FIG. 6B is a circuit diagram of the memory cell corresponding to the cross-sectional view of FIG. 6A.

Note that when deciding whether to adopt the adjacent unselected bit lines as the assist wiring lines as shown in FIG. 4 or to adopt the adjacent unselected word lines as the assist wiring lines as shown in FIG. 5, consideration may be given to a distance between the diode DI and the wiring lines. Specifically, selecting the wiring lines close to the diode DI allows the effect of the potential difference between the adjacent unselected wiring lines and the selected wiring line to be more greatly increased and advantages of the present invention to be proportionately more greatly obtained. In other words, in the case that the bit line BL is closer to the diode DI of the memory cell MC than is the word line WL as shown in FIG. 4, it is more effective to adopt the adjacent unselected bit lines BL as the assist wiring lines. On the other hand, in the case that the word line WL is closer to the diode DI of the memory cell MC than is the bit line BL as in the memory cell MC having a cross-section shown in FIG. 6A and a circuit structure shown in FIG. 6B, it is more effective to adopt the adjacent unselected word lines WL as the assist wiring lines.

As is clear from the above, the present embodiment allows the operation current to be caused to flow in the selected memory cell by application of a lower operation voltage than in the comparative example, and also allows the leak current to the selected bit line or the selected word line due to off leak current flowing in the half-selected memory cells to be suppressed. As a result, the present embodiment allows provision of a nonvolatile semiconductor memory device having a smaller power consumption during the resetting operation than does the comparative example.

Second Embodiment

The first embodiment described an erase operation where the adjacent unselected bit lines are adopted as the assist wiring lines and an erase operation where the adjacent unselected word lines are adopted as the assist wiring lines. The first embodiment also referred to which of the adjacent unselected bit lines and the adjacent unselected word lines should be adopted as the assist wiring lines when consideration is given to a positional relationship between the wiring lines and the diode.

The second embodiment describes which of the adjacent unselected bit lines and the adjacent unselected word lines should be adopted as the assist wiring lines when consideration is given to a size in the column direction and the row direction of the memory cell array.

Figure 7:
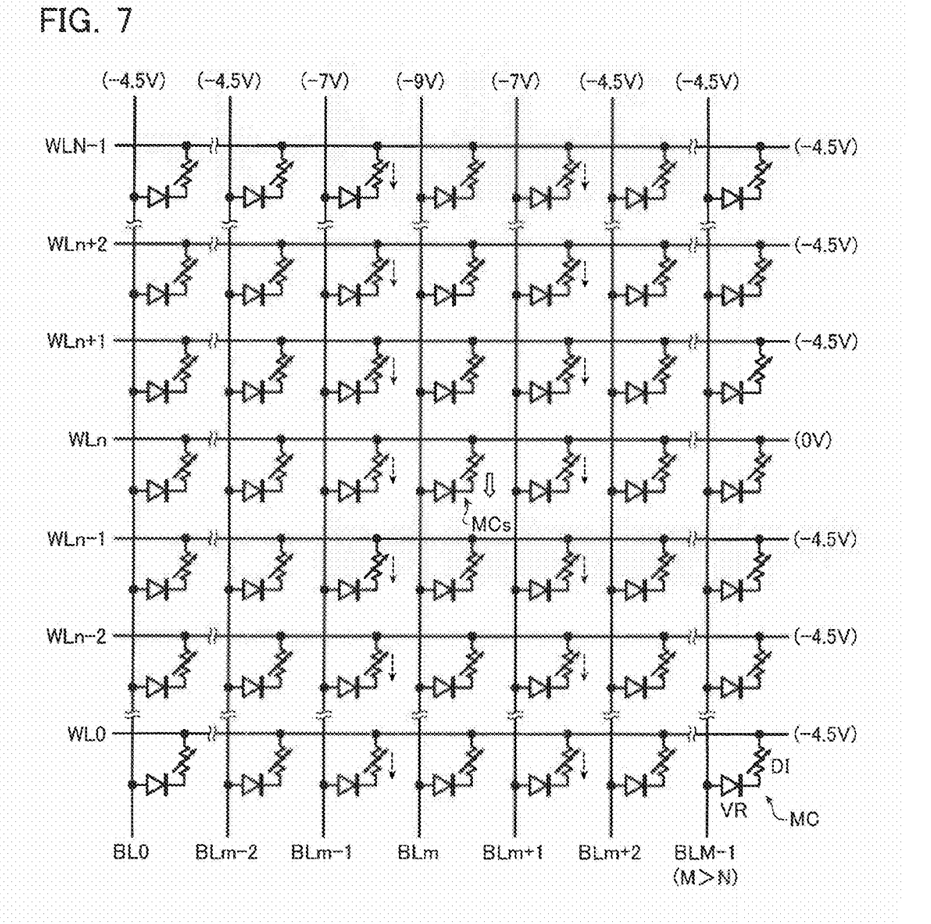
FIG. 7 is a view showing a bias state of a memory cell array in a nonvolatile semiconductor memory device according to a second embodiment.
Figure 8:
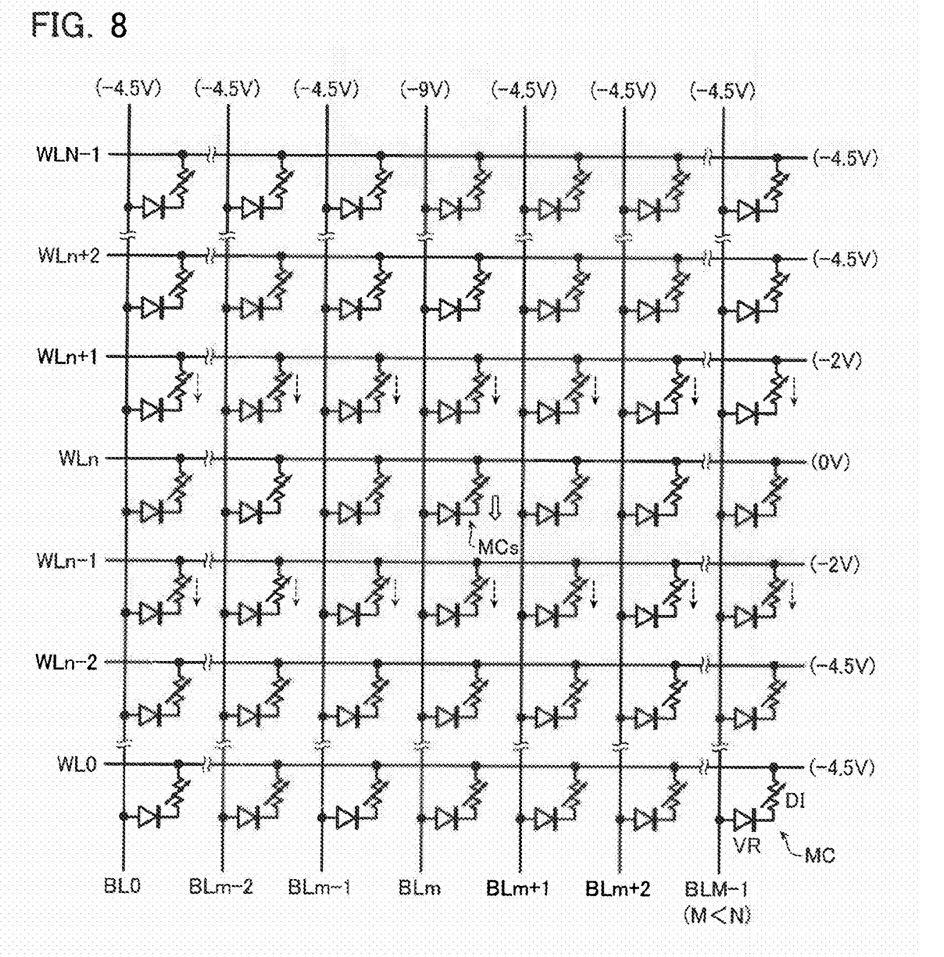
FIG. 8 is a view showing a bias state of the memory cell array in the nonvolatile semiconductor memory device according to the same embodiment.

FIG. 7 and FIG. 8 are views showing bias states of a memory cell array 1 in a nonvolatile semiconductor memory device according to the present embodiment. FIG. 7 and FIG. 8 are of bias states in the case where the bit line BLm is adopted as the selected bit line and the word line WLn is adopted as the selected word line. In FIG. 7 and FIG. 8, the outline arrow indicates the operation current flowing in the selected memory cell MCs, and the broken line arrows indicate the off leak current flowing during the erase operation.

As previously mentioned, applying the assist voltage to the assist wiring lines enables greater enlargement of the operation current and reduction of the operation voltage of the selected memory cell to be achieved than in the comparative example. However, on the other hand, because this causes a large reverse direction bias to be applied to the unselected memory cells connected to the assist wiring lines, the overall off leak current in the memory cell array increases proportionately. In other words, when considering power consumption, it is desirable that the number of unselected memory cells connected to the assist wiring lines is small.

Specifically, as shown in FIG. 7, when the number M of bit lines BL is greater than the number N of word lines WL, the adjacent unselected bit lines BLm−1 and BLm+1 are adopted as the assist wiring lines, the selected bit line voltage (for example, −9 V) is applied to the selected bit line BLm, the unselected bit line voltage (for example, −4.5 V) is applied to the unselected bit lines BL, and the adjacent unselected bit line voltage (which is the assist voltage, for example, −7 V) which is higher than the selected bit line voltage and lower than the unselected bit line voltage is applied to the adjacent unselected bit lines BLm−1 and BLm+1 from the column control circuit 2, and the selected word line voltage (for example, 0 V) is applied to the selected word line WLn and the unselected word line voltage (for example, −4.5 V) is applied to the unselected word lines WL from the row control circuit 3.

Similarly, as shown in FIG. 8, when the number N of word lines WL is greater than the number M of bit lines BL, the adjacent unselected word lines WLn−1 and WLn+1 are adopted as the assist wiring lines, the selected bit line voltage (for example, −9 V) is applied to the selected bit line BLm and the unselected bit line voltage (for example, −4.5 V) is applied to the unselected bit lines BL from the column control circuit 2, and the selected word line voltage (for example, 0 V) is applied to the selected word line WLn, the unselected word line voltage (for example, −4.5 V) is applied to the unselected word lines WL, and the adjacent unselected word line voltage (which is the assist voltage, for example, −2 V) which is lower than the selected word line voltage and higher than the unselected word line voltage is applied to the adjacent unselected word lines WLn−1 and WLn+1 from the row control circuit 3.

Adopting the adjacent unselected wiring lines according to whichever it is of the bit lines BL and the word lines WL that has the greater number of lines as the assist wiring lines in this way allows the number of unselected memory cells connected to the assist wiring lines to be further reduced. This enables the off leak current flowing in the unselected memory cells MC indicated by the broken line arrows in each of FIG. 7 and FIG. 8 to be reduced.

As is clear from the above, the present embodiment allows similar advantages to those of the first embodiment to be obtained simply by a smaller increase in the off leak current, in the case that size of the memory cell array differs between the row direction and the column direction.

Third Embodiment

The first and second embodiments described an erase operation where either of the adjacent unselected bit lines and the adjacent unselected word lines are adopted as the assist wiring lines.

The third embodiment describes an erase operation where both the adjacent unselected bit lines and the adjacent unselected word lines are adopted as the assist wiring lines.

Figure 9:
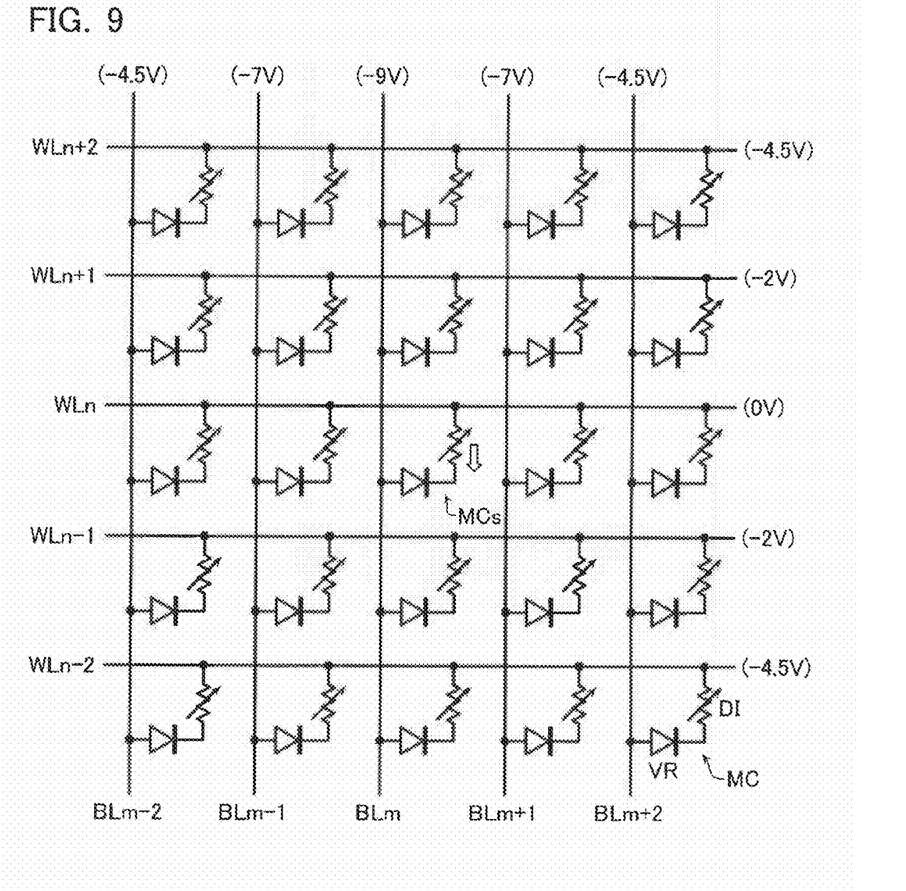
FIG. 9 is a view showing a bias state of a memory cell array in a nonvolatile semiconductor memory device according to a third embodiment.

FIG. 9 is a view showing a bias state of a memory cell array 1 in a nonvolatile semiconductor memory device according to the present embodiment. FIG. 9 is of a bias state in the case where the bit line BLm is adopted as the selected bit line and the word line WLn is adopted as the selected word line. In FIG. 9, the outline arrow indicates the operation current flowing in the selected memory cell MCs.

In the case of the present embodiment, the adjacent unselected bit lines BLm−1 and BLm+1 and the adjacent unselected word lines WLn−1 and WLn+1 are adopted as the assist wiring lines, the selected bit line voltage (for example, −9 V) is applied to the selected bit line BLm, the unselected bit line voltage (for example, −4.5 V) is applied to the unselected bit lines BL, and the adjacent unselected bit line voltage (which is the assist voltage, for example, −7 V) which is higher than the selected bit line voltage and lower than the unselected bit line voltage is applied to the adjacent unselected bit lines BLm−1 and BLm+1 from the column control circuit 2, and the selected word line voltage (for example, 0 V) is applied to the selected word line WLn, the unselected word line voltage (for example, −4.5 V) is applied to the unselected word lines WL, and the adjacent unselected word line voltage (which is the assist voltage, for example, −2 V) which is higher than the unselected word line voltage and lower than the selected word line voltage is applied to the adjacent unselected word lines WLn−1 and WLn+1 from the row control circuit 3.

This enables lowering of hole concentration in the P type semiconductor film to be suppressed and electron concentration in the N type semiconductor film to be improved in the diode DI of the selected memory cell MCs. As a result, the present embodiment allows achievement of a greater increase in the operation current at an identical operation voltage or a greater decrease in the operation voltage for causing an identical operation current to flow than in the comparative example.

Figure 10:
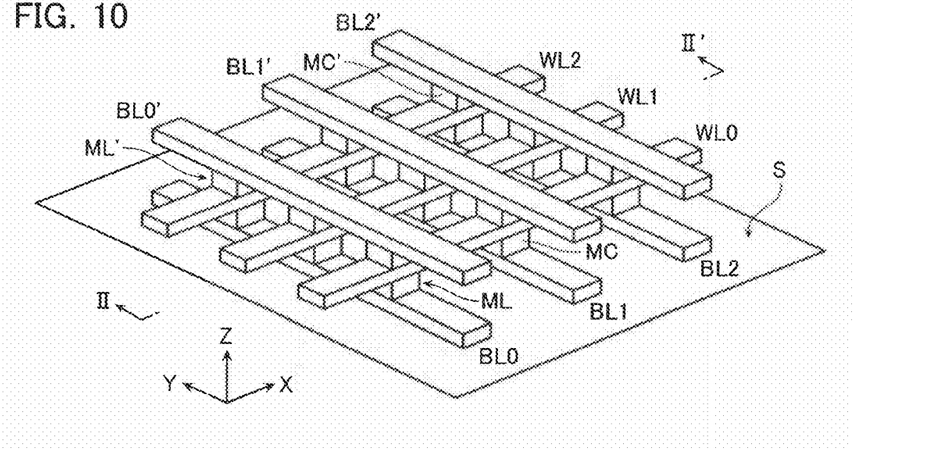
FIG. 10 is a perspective view of part of the memory cell array in the nonvolatile semiconductor memory device according to the same embodiment.
Figure 11A:
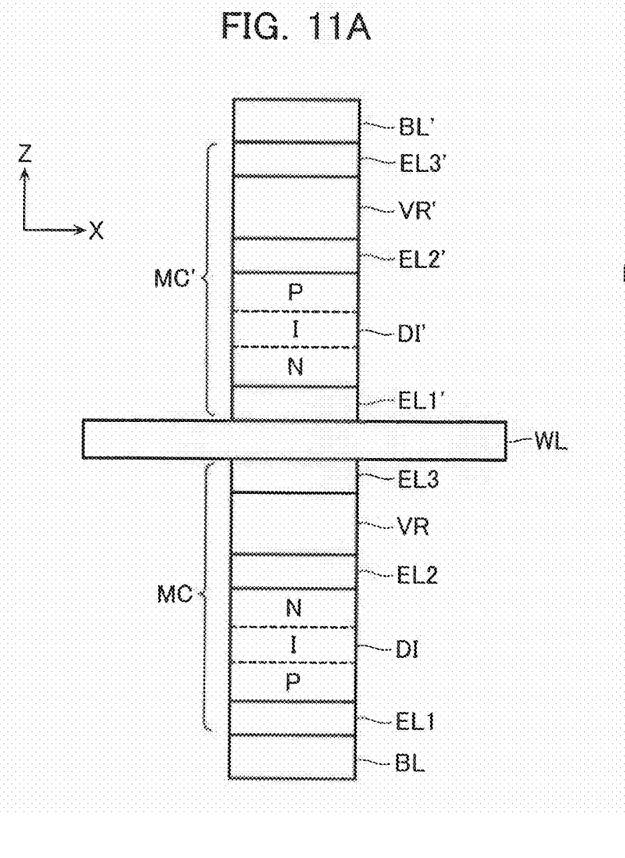
FIG. 11A is a cross-sectional view of a memory cell in the nonvolatile semiconductor memory device according to the same embodiment.
Figure 11B:
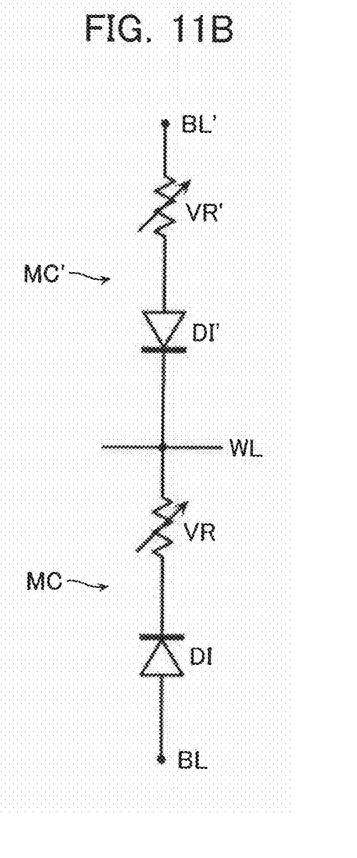
FIG. 11B is a circuit diagram of the memory cell corresponding to the cross-sectional view of FIG. 11A.

Note that the present embodiment is advantageous in the case where the memory cell array 1 includes a plurality of stacked memory cell layers, and the memory cell layers adjacent in the stacking direction share the plurality of bit lines or the plurality of word lines. For example, when the memory cell array 1 is configured from two stacked memory cell layers ML and ML' and the memory cell layers ML and ML' share the plurality of word lines WL as shown in FIG. 10, the memory cell MC sometimes has a structure like in a cross-section shown in FIG. 11A (this is a cross-section taken along the line II-II' and viewed in the direction of the arrows shown in FIG. 10) and a circuit shown in FIG. 11B. Specifically, the memory cell MC in the memory cell layer ML has a structure where, stacked in the following order from the bit line BL toward the word line WL, are an electrode EL1, a diode DI (a P type semiconductor film, an intrinsic semiconductor film, and an N type semiconductor film), an electrode EL2, a variable resistance element VR, and an electrode EL3. On the other hand, a memory cell MC' in the memory cell layer ML' has a structure where, stacked in the following order from the word line WL toward a bit line BL', are an electrode EL1', a diode DI' (an N type semiconductor film, an intrinsic semiconductor film, and a P type semiconductor film) an electrode EL2', a variable resistance element VR', and an electrode EL3'. In other words, a stacking order of the diode DI and the variable resistance element VR and a stacking order of the diode DI' and the variable resistance element VR' are configured the same for the memory cell MC and the memory cell MC'. Therefore, in the memory cell layer ML, the bit line BL is a closer wiring line to the diode DI of the memory cell MC than is the word line WL, and in the memory cell layer ML', the word line WL is a closer wiring line to the diode DI' of the memory cell MC' than is the bit line BL'. In this case, adopting only one of the adjacent unselected bit lines BL (BL') and the adjacent unselected word lines WL is sometimes a cause of variation occurring in the operation voltage and the operation current on a memory cell layer ML (ML') basis.

In this respect, because both the adjacent unselected bit lines and the adjacent unselected word lines are adopted as the assist wiring lines, the present embodiment enables variation in each of the memory cell layers to be reduced. This is the same even for a memory cell array configured by three or more memory cell layers and is not limited to the memory cell array configured by two memory cell layers as in FIG. 10.

As is clear from the above, the present embodiment, even when it is a nonvolatile semiconductor memory device comprising a memory cell array having a structure where wiring lines are shared by two memory cell layers adjacent in the stacking direction, enables similar advantages to those of the first and second embodiments to be obtained while suppressing variation in each of the memory cell layers.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a memory cell array including a plurality of first lines and a plurality of second lines that intersect one another, and a plurality of memory cells provided at each of intersections of the plurality of first lines and the plurality of second lines; and
a control circuit for applying a voltage to the plurality of first lines and the plurality of second lines,
each of the memory cells including a variable resistance element and a rectifier element connected in series, and having one of the first lines connected to an anode side of said rectifier element and one of the second lines connected to a cathode side of said rectifier element,
and, when it is assumed that one of the memory cells which is to be an access target is a selected memory cell, one of the first lines connected to the selected memory cell is a selected first line, one of the first lines adjacent to the selected first line is an adjacent unselected first line, a remaining one of the first lines is an unselected first line, one of the second lines connected to the selected memory cell is a selected second line, and a remaining one of the second lines is an unselected second line,
the control circuit applying a selected first line voltage to the selected first line, an adjacent unselected first line voltage which is larger than the selected first line voltage to the adjacent unselected first line, and an unselected first line voltage which is larger than the adjacent unselected first line voltage to the unselected first line, and applying a selected second line voltage which is larger than the selected first line voltage to the selected second line and an unselected second line voltage which is smaller than the selected second line voltage to the unselected second line.

2. The nonvolatile semiconductor memory device according to claim 1, wherein
the rectifier element of the memory cell is connected closer to a first line side than is the variable resistance element.

3. The nonvolatile semiconductor memory device according to claim 1, wherein
the number of first lines is less than the number of second lines.

4. The nonvolatile semiconductor memory device according to claim 1, wherein
the memory cell array is configured having a plurality of memory cell layers stacked, each of the memory cell layers configured from the plurality of first lines, the plurality of second lines, and the plurality of memory cells.

5. The nonvolatile semiconductor memory device according to claim 4, wherein
two of the memory cell layers adjacent in the stacking direction share the plurality of first lines or the plurality of second lines.

6. The nonvolatile semiconductor memory device according to claim 1, wherein
the unselected first line voltage is the same as the unselected second line voltage.

7. The nonvolatile semiconductor memory device according to claim 1, wherein
the rectifier element is a PIN diode.

8. A nonvolatile semiconductor memory device, comprising:
a memory cell array including a plurality of first lines and a plurality of second lines that intersect one another, and a plurality of memory cells provided at each of intersections of the plurality of first lines and the plurality of second lines; and
a control circuit for applying a voltage to the plurality of first lines and the plurality of second lines,
each of the memory cells including a variable resistance element and a rectifier element connected in series, and having one of the first lines connected to an anode side of said rectifier element and one of the second lines connected to a cathode side of said rectifier element,
and, when it is assumed that one of the memory cells which is to be an access target is a selected memory cell, one of the first lines connected to the selected memory cell is a selected first line, a remaining one of the first lines is an unselected first line, one of the second lines connected to the selected memory cell is a selected second line, one of the second lines adjacent to the selected second line is an adjacent unselected second line, and a remaining one of the second lines is an unselected second line, the control circuit applying a selected first line voltage to the selected first line and an unselected first line voltage which is larger than the selected first line voltage to the unselected first line, and applying a selected second line voltage which is larger than the selected first line voltage to the selected second line, an adjacent unselected second line voltage which is smaller than the selected second line voltage to the adjacent unselected second line, and an unselected second line voltage which is smaller than the adjacent unselected second line voltage to the unselected second line.

9. The nonvolatile semiconductor memory device according to claim 8, wherein the rectifier element of the memory cell is connected closer to a second line side than the variable resistance element is.

10. The nonvolatile semiconductor memory device according to claim 8, wherein the number of second lines is less than the number of first lines.

11. The nonvolatile semiconductor memory device according to claim 8, wherein the memory cell array is configured having a plurality of memory cell layers stacked, each of the memory cell layers configured from the plurality of first lines, the plurality of second lines, and the plurality of memory cells.

12. The nonvolatile semiconductor memory device according to claim 11, wherein two of the memory cell layers adjacent in the stacking direction share the plurality of first lines or the plurality of second lines.

13. The nonvolatile semiconductor memory device according to claim 8, wherein the unselected first line voltage is the same as the unselected second line voltage.

14. The nonvolatile semiconductor memory device according to claim 8, wherein the rectifier element is a PIN diode.

15. A nonvolatile semiconductor memory device, comprising:

a memory cell array including a plurality of first lines and a plurality of second lines that intersect one another, and a plurality of memory cells provided at each of intersections of the plurality of first lines and the plurality of second lines; and a control circuit for applying a voltage to the plurality of first lines and the plurality of second lines, each of the memory cells including a variable resistance element and a rectifier element connected in series, and having one of the first lines connected to an anode side of said rectifier element and one of the second lines connected to a cathode side of said rectifier element, and, when it is assumed that one of the memory cells which is to be an access target is a selected memory cell, one of the first lines connected to the selected memory cell is a selected first line, one of the first lines adjacent to the selected first line is an adjacent unselected first line, a remaining one of the first lines is an unselected first line, one of the second lines connected to the selected memory cell is a selected second line, one of the second lines adjacent to the selected second line is an adjacent unselected second line, and a remaining one of the second lines is an unselected second line, the control circuit applying a selected first line voltage to the selected first line, an adjacent unselected first line voltage which is larger than the selected first line voltage to the adjacent unselected first line, and an unselected first line voltage which is larger than the adjacent unselected first line voltage to the unselected first line, and applying a selected second line voltage which is larger than the selected first line voltage to the selected second line, an adjacent unselected second line voltage which is smaller than the selected second line voltage to the adjacent unselected second line, and an unselected second line voltage which is smaller than the adjacent unselected second line voltage to the unselected second line.

16. The nonvolatile semiconductor memory device according to claim 15, wherein the memory cell array is configured having a plurality of memory cell layers stacked, each of the memory cell layers configured from the plurality of first lines, the plurality of second lines, and the plurality of memory cells.

17. The nonvolatile semiconductor memory device according to claim 16, wherein two of the memory cell layers adjacent in the stacking direction share the plurality of first lines or the plurality of second lines.

18. The nonvolatile semiconductor memory device according to claim 17, wherein a stacking order of the variable resistance element and the rectifier element of the memory cells in each of the memory cell layers is the same.

19. The nonvolatile semiconductor memory device according to claim 15, wherein the unselected first line voltage is the same as the unselected second line voltage.

20. The nonvolatile semiconductor memory device according to claim 15, wherein the rectifier element is a PIN diode.

* * * * *